(12) United States Patent
Sarkar et al.

(10) Patent No.: US 12,132,470 B2
(45) Date of Patent: Oct. 29, 2024

(54) UNDER VOLTAGE LOCK-OUT CIRCUIT

(71) Applicant: Tagore Technology, Inc., Arlington Heights, IL (US)

(72) Inventors: Pramit Sarkar, Kolkata (IN); Manish Shah, Vernon Hills, IL (US)

(73) Assignee: TAGORE TECHNOLOGY, INC., Arlington, IL (US)

( * ) Notice: Subject to any disclaimer, the term of this patent is extended or adjusted under 35 U.S.C. 154(b) by 319 days.

(21) Appl. No.: 17/548,765

(22) Filed: Dec. 13, 2021

(65) Prior Publication Data
US 2023/0188128 A1 Jun. 15, 2023

(51) Int. Cl.
H03K 17/0812 (2006.01)
H01L 23/62 (2006.01)
H01L 29/20 (2006.01)

(52) U.S. Cl.
CPC ........ *H03K 17/08122* (2013.01); *H01L 23/62* (2013.01); *H01L 29/2003* (2013.01)

(58) Field of Classification Search
CPC .............................................. H03K 17/08122
See application file for complete search history.

(56) References Cited

U.S. PATENT DOCUMENTS

| | | |
|---|---|---|
| 9,716,395 B2 | 7/2017 | Kinzer et al. |
| 9,929,652 B1 | 3/2018 | Ribarich et al. |
| 2015/0286239 A1* | 10/2015 | Regier ...................... G05F 3/16 323/313 |
| 2018/0269863 A1* | 9/2018 | Suh ....................... H03K 17/164 |
| 2019/0109589 A1* | 4/2019 | Kobayashi ........... H03K 5/2472 |

OTHER PUBLICATIONS

Lou Frenzel, "GaN FETs Redefine Power-Circuit Designs", Electronic Design, https://www.electronicdesign.com/power-management/article/21804876/gan-fets-redefine-powercircuit-designs, Apr. 13, 2017.
Vivet Mehrotra et al., "GaN HEMT-Based >1-GHz Speed Low-Side Gate Driver and Switch Monolithic Process for 865-MHz Power Conversion Applications", IEEE Journal of Emerging and Selected Topics in Power Electronics, Sep. 2016, pp. 918-925, vol. 4, No. 3, IEEE, US.

(Continued)

*Primary Examiner* — Metasebia T Retebo
(74) *Attorney, Agent, or Firm* — Fleit Intellectual Property Law; Jon Gibbons

(57) ABSTRACT

An integrated circuit includes a substrate, a GaN FET power switch disposed on the substrate, and a totally-GaN-based driver disposed on the substrate and coupled to the GaN FET power switch. The totally-GaN-based driver has an input terminal for receiving a supply voltage and includes an under-voltage detector having an output terminal. The under-voltage detector outputs a UVLO signal when the supply voltage is below a low-to-high threshold value, and does not output the UVLO signal when the supply voltage is above the low-to-high threshold value. The totally-GaN-based driver includes a pulse stretcher having an input terminal coupled to the output terminal of the under-voltage detector, and an output terminal for outputting a stretched_UVLO signal for a predetermined amount of time after the supply voltage first rises above the low-to-high threshold value.

14 Claims, 8 Drawing Sheets

(56) References Cited

OTHER PUBLICATIONS

Yuki Yamashita et al., "Monolithically Integrated E-mode GaN-on-SOI Gate Driver with Power GaN-HEMT for MHZ-Switching", 978-1-5386-5909-0, 2018, IEEE, US.
Edward A. Jones, "Review of Commercial GaN Power Devices and GaN-Based Converter Design Challenges", IEEE Journal of Emerging and Selected Topics in Power Electronics, Sep. 2016, p. 707-719, vol. 4, No. 3, IEEE, US.
"Undervoltage-lockout", https://en.wikipedia.org/wiki/Undervoltage-lockout, Mar. 15, 2020.
"What is the UVLO function?", https://toshiba.semicon-storage.com/ap-en/semiconductor/knowledge/faq/opto/opto-036.html, Jul. 2021, Toshiba Electronic Devices & Storage Corporation.

* cited by examiner

UNDER VOLTAGE LOCK-OUT CIRCUIT

BACKGROUND

Field

This invention relates generally to active solid-state devices, and more specifically to an under voltage lock-out circuit fabricated using a gallium nitride semiconductor process.

Related Art

A semiconductor power switch allows or blocks flow of electric current as dictated by a signal received at its control input which is typically its gate terminal. A semiconductor power switch usually needs a driver for its proper operation.

The driver receives command signals from a controller to turn on or turn off the semiconductor power switch, and then the driver communicates a signal to the semiconductor power switch while providing necessary current and voltage levels in a way which is suitable and safe. The driver also controls a rate of turn-on and turn-off as required by an application. The driver helps maintain the off condition or the on condition in face of an environmental or an application-generated disturbance. The driver may also provide other functions such as safety from over voltage or under voltage, and safety from high current, excessive rate of change of voltage, and excessive temperature.

A gallium nitride (hereinafter "GaN") device may be used as a semiconductor power switch and provides benefits of high switching speeds and low switching losses for a given breakdown voltage and switch size. These characteristics are beneficial in a number of applications ranging from power electronics converters to audio amplifiers to LiDAR.

When used as a switching device, the benefit of a high switching speed is more fully realized only when a GaN device is made capable of operating at a high speed of operation. If a semiconductor power switch and its driver are not on the same die, then parasitic elements, such as die-to-die or die-to-package inductances and capacitances limit the speed of operation. Therefore, if a GaN semiconductor power switch and its GaN driver are made on the same die, i.e., both are fabricated in a GaN process, then potentially much better speed of operation and performance can be achieved.

At the present state of the art, commercially available GaN process produces only N-type of devices, and complementary P-types are not available. Therefore, complementary metal oxide semiconductor (hereinafter "CMOS") type of designs, which rely heavily on complementary devices, are not possible for circuits fabricated in a GaN process. A lack of complementary devices greatly limits choice and performance of circuits in GaN technology.

A GaN transistor, often called a high-electron-mobility transistor (hereinafter "HEMT"), can be a depletion-mode device or an enhancement-mode device. Transistors of both types provide an on path from drain-to-source terminals when the gate-to-source voltage is higher than a certain threshold voltage ($V_T$). A depletion-mode device has a negative $V_T$ and hence is normally-on device. That is, even when its gate-to-source voltage is 0V, the device is on. The depletion device turns off only when its gate terminal is biased at a negative voltage with respect to its source terminal by a margin larger than the threshold voltage. On the other hand, an enhancement-mode device has a positive $V_T$, and hence it is a normally-off device. That is, the device is off when its gate to source voltage is zero, and it turns on only when the gate to source voltage goes above the positive $V_T$ of the device.

A depletion-mode device or an enhancement-mode device may be used as a power switch, but because a depletion-mode device is normally on, it needs a series device in a different process (for example, a silicon process) or a complicated negative gate drive voltage to turn it off. Therefore, an enhancement-mode HEMT device has a clear advantage in terms of gate drive requirement, and is usually the device of choice.

An enhancement-mode HEMT is normally on when its gate-to-source voltage is 0V. An N-channel, enhancement-mode HEMT turns off when its gate-to-source voltage is less than its threshold voltage or when its gate terminal is biased at a negative voltage with respect to its source terminal.

The behavior of GaN devices is not exactly the same as the behavior of silicon devices. In general, process variations are higher in GaN processes than in silicon processes. For example, the threshold voltage of a GaN device changes by a much larger amount due to process variations than does the threshold voltage of a CMOS device due to process variations. The threshold voltage of GaN HEMT may vary, for example, from 0.5V to 2.2V depending upon the manufacturing process. However, the threshold voltage of all GaN high-electron-mobility transistors in a die is within a reasonable range.

GaN wafers are relatively costly as compared to silicon wafers, and, as device minimum sizes are still quite large, packaging densities are low. This means that only simple circuits with a limited number of components can be packed within a die in a cost-effective manner.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
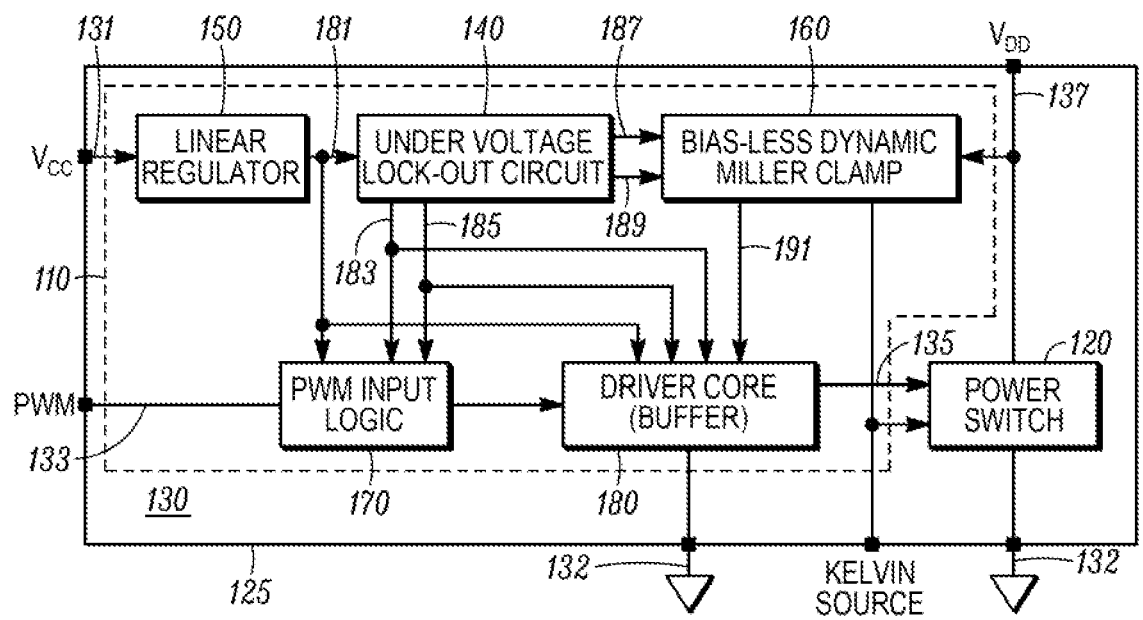
FIG. 1 is a simplified block diagram of system-level architecture of an electronic system comprising a GaN driver including an under voltage lock-out circuit in accordance with the invention and a GaN power switch.

FIG. 1 is a simplified block diagram of system-level architecture of an electronic system 100 including a GaN driver 110 and a GaN field-effect transistor (hereinafter "FET") power switch 120 in accordance with one embodiment of the invention. An integrated circuit 125 in accordance with one embodiment of the invention comprises the GaN driver 110 and the GaN FET power switch (hereinafter "GaN power switch") 120 monolithically integrated on a single substrate, or die 130. The single die 130 may be disposed in a microelectronic package (not shown). An output terminal of the GaN driver 110 is coupled to a gate terminal of the GaN power switch 120. The GaN driver 110 is coupled to a low-voltage (less than 30V) positive supply $V_{CC}$ 131 which may be unregulated. The GaN driver 110 is also coupled to a ground terminal 132. The GaN driver 110 typically receives a low voltage digital or pulse width modulated (PWM) signal 133 from a controller (not shown). The GaN driver 110 creates an output signal 135 having a same frequency and duty cycle as the signal from the controller but strong enough to handle capacitance of the GaN power switch 120. The GaN power switch 120 is coupled to a high-voltage (approximately 300V to 600V) positive power supply $V_{DD}$ 137 and to the ground terminal 132.

In one embodiment, the GaN driver 110 comprises an under voltage lock-out circuit 140 in accordance with the invention, a linear regulator 150, a bias-less dynamic Miller clamp 160, a PWM input logic circuit 170, and a driver core (buffer) circuit 180, coupled as shown in FIG. 1. The under voltage lock-out circuit 140 receives a regulated supply voltage $V_{SUPP}$ 181 from the linear regular 150. The under voltage lock-out circuit 140 outputs an under voltage lock-out (hereinafter "UVLO") signal 183 and a stretched_UVLO signal 185 to the PWM input logic circuit 170 and to the driver core (buffer) circuit 180. The under voltage lock-out circuit 140 also outputs a stretched_UVLO_b signal 187 and a UVLO_b signal 189 to the bias-less dynamic Miller clamp 160. The bias-less dynamic Miller clamp 160 outputs a gate pulldown device signal 191 to the driver core (buffer) circuit 180.

For an integrated circuit to work properly as intended, its supply voltage needs to be within a predetermined range. If $V_{SUPP}$ 181 of the integrated circuit 125 is not within the predetermined range, and if the GaN driver 110 nevertheless were to pass the output signal 135 to the GaN power switch 120, then the GaN power switch might turn on with a high on-state resistance. If the GaN power switch 120 were to conduct a rated amount of current, then, due to its high on-state resistance, generated heat will be greater than its design capacity, which may damage the GaN power switch. When $V_{SUPP}$ 181 is low, some or all of the parts of the integrated circuit 125 might malfunction which can lead to serious failures.

The under voltage lock-out circuit 140 disables (or locks-out) at least some functionalities of the GaN driver 110 when $V_{SUPP}$ 181 is below the predetermined range. When the under voltage lock-out circuit 140 disables at least some functionalities of the GaN driver 110, a gate voltage 135 of the GaN power switch 120 remains low. The low gate voltage causes the GaN power switch 120 to remain off regardless of the PWM signal 133 from the controller.

When $V_{SUPP}$ 181 of the integrated circuit 125 is within the predetermined range, the PWM signal 133 is allowed to pass through the GaN driver 110 to control the gate of the GaN power switch 120.

A function of the under voltage lock-out circuit 140 is to change a state of its output signals (UVLO 183, stretched_UVLO 185, stretched_UVLO_b 187 and UVLO_b 189) as $V_{SUPP}$ crosses a specified threshold. The output signals from the under voltage lock-out circuit 140 are used to enable/disable various circuitry in the GaN driver 110. A value of $V_{SUPP}$ 181 at which the under voltage lock-out circuit 140 changes the state of its output signals is a UVLO threshold. Normally, a UVLO threshold while $V_{SUPP}$ 181 is ramping up is kept slightly higher than a UVLO threshold when $V_{SUPP}$ is ramping down, and the two are known as a positive-going threshold (UVLO_high_threshold) and a negative-going threshold (UVLO_low_threshold), respectively. See FIG. 8. A difference between the two is UVLO hysteresis.

Figure 2:
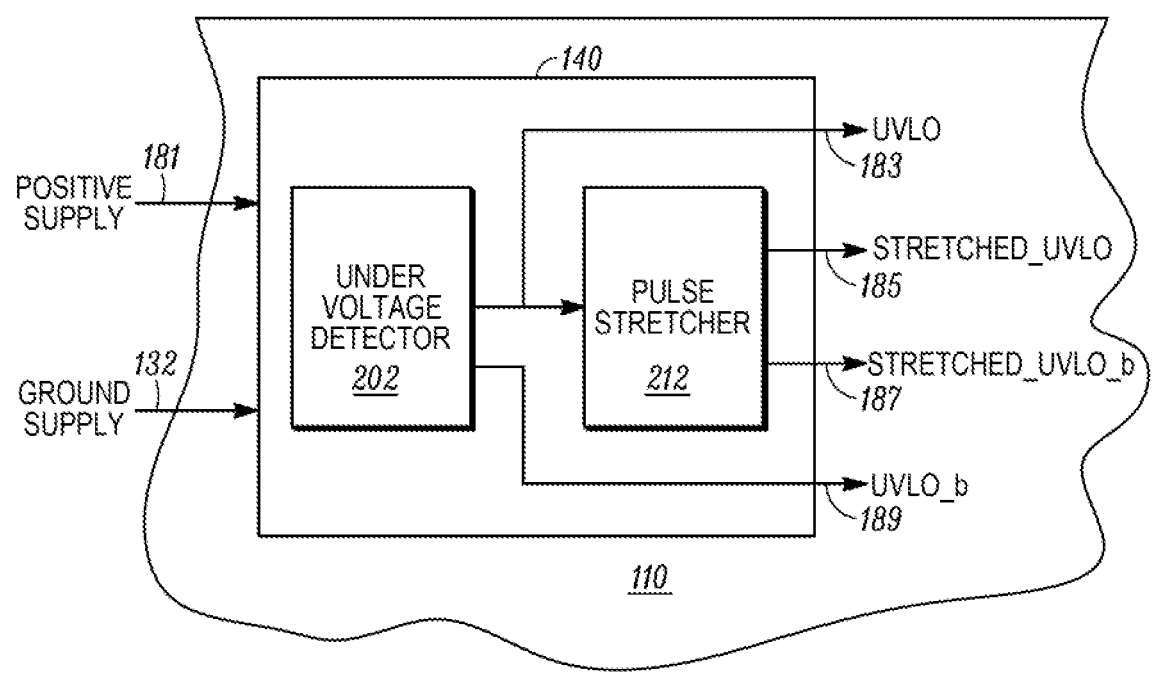
FIG. 2 is a simplified block diagram of subsystem-level architecture of a first embodiment of the under voltage lock-out circuit including an under-voltage detector in accordance with the invention, and a pulse stretcher in accordance with the invention.

FIG. 2 is a simplified block diagram 200 of subsystem-level architecture of a first embodiment of the under-voltage lock-out circuit 140 in accordance with the invention. The first embodiment of the under-voltage lock-out circuit 140 comprises an under-voltage detector 202 in accordance with the invention, and a pulse stretcher 212 in accordance with the invention.

For the detection of an under-voltage condition of the supply voltage $V_{SUPP}$ 181, the supply voltage $V_{SUPP}$ is compared against a reference voltage. In the first embodiment of the under-voltage lock-out circuit 140 the reference voltage is internally derived. The under-voltage detector 202 generates the UVLO signal 183 and the UVLO_b signal 189. The under-voltage detector 202 outputs the UVLO signal 183 to the pulse stretcher 212. The under-voltage detector 202 outputs the UVLO signal 183 and the UVLO_b signal 189 to the bias-less dynamic Miller clamp 160.

Figure 3:
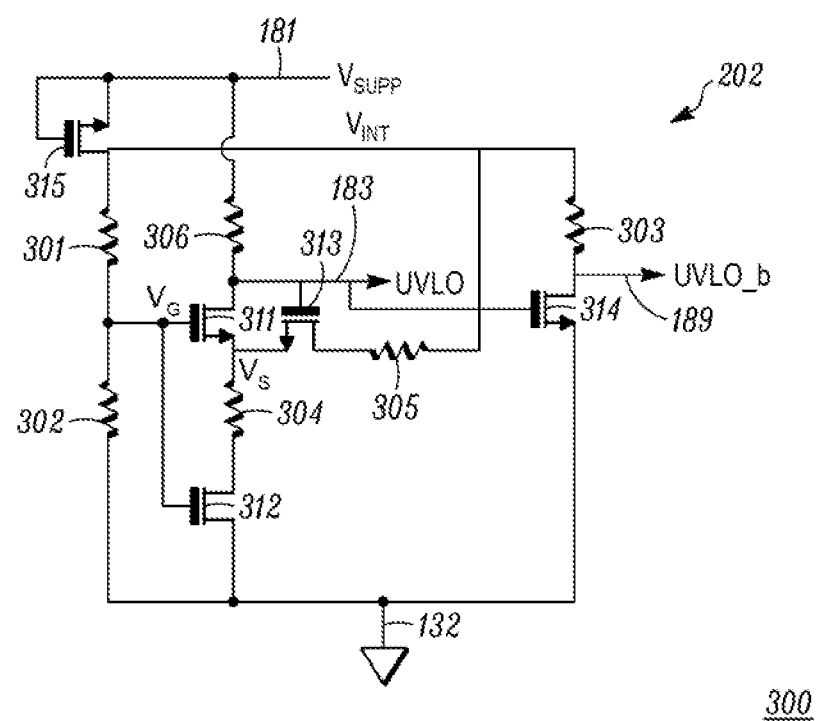
FIG. 3 is a simplified schematic of an embodiment of the under-voltage detector of FIG. 2.

FIG. 3 is a simplified schematic 300 of the under-voltage detector 202. In this embodiment, the under-voltage detector 202 derives its reference voltage $V_{INT}$ from the supply voltage $V_{SUPP}$. $V_{INT}$ is a scaled version of the supply voltage $V_{SUPP}$ which is the voltage being monitored by the under voltage lock-out circuit 140. The simplified schematic 300 includes a GaN transistor 315 whose source terminal and gate terminal are coupled to the positive supply terminal, and whose drain terminal is coupled to one end of a resister divider comprising GaN resistor 301 and GaN resistor 302. Another end of the resistor divider is coupled to the ground terminal 132. The supply voltage $V_{SUPP}$ 181 passes through GaN transistor 315 and generates a voltage $V_{INT}$ at its drain terminal. $V_{INT}$ is scaled down by the resistor divider. The voltage $V_{INT}$ is a diode drop lower than the supply voltage $V_{SUPP}$ 181. A node between GaN resistor 301 and GaN resistor 302 is coupled to a gate terminal of GaN transistor 311 and to a gate terminal of GaN transistor 312. A GaN resistor 304 is coupled between a source terminal of GaN transistor 311 and a drain terminal of GaN transistor 312.

The simplified schematic 300 also includes a GaN resistor 306 having one end coupled to the positive supply terminal and having another end coupled to a drain terminal of GaN transistor 311 and to a gate terminal of GaN transistor 313. A source terminal of GaN transistor 313 is coupled to the source terminal of GaN transistor 311. GaN resistor 305 is coupled between the drain terminal of GaN transistor 313 and a drain terminal of GaN transistor 315. The simplified schematic 300 also includes a GaN transistor 314 having a source terminal coupled to the ground terminal 132 and a gate terminal coupled to the drain terminal of GaN resistor 311.

The simplified schematic 300 includes a GaN transistor 314 having a gate terminal coupled to the drain terminal of GaN transistor 311, a source terminal coupled to the ground terminal 132, and a drain terminal coupled to one end of a GaN resistor 303. The other end of GaN resistor 303 is coupled to the internal reference voltage $V_{INT}$ at the drain terminal of GaN transistor 315. A voltage at the drain terminal of GaN transistor 311 produces the UVLO signal 183. A voltage at the drain of GaN transistor 314 produces the UVLO_b signal 189.

As the voltage $V_{SUPP}$ rises, the UVLO signal 183 tracks the supply voltage $V_{SUPP}$ 181.

Once $V_{INT}$ reaches a voltage greater than the threshold voltage of GaN transistor 311 and the voltage drop across resistor 304, transistor 311 turns on, the voltage of the UVLO signal 183 goes to zero and the voltage of the UVLO_b signal 189 goes to $V_{INT}$.

Likewise, as $V_{SUPP}$ starts to fall and drops below the required gate-to-source voltage of GaN transistor 311, GaN transistor 311 turns off, and the UVLO signal 183 starts to track the positive supply $V_{SUPP}$.

Advantageously, the simplified schematic 300 generates the UVLO signal 183 without relying on a bandgap voltage, without using an external reference voltage and without using a traditional voltage comparator.

Advantageously, the positive-going threshold (UVLO_high_threshold) of the simplified schematic 300 is greater than $2V_T$ of the fabrication process. Furthermore, the positive-going threshold tracks the $V_T$ of the fabrication process.

The low-to-high voltage threshold (UVLO_high_threshold) occurs when the GaN transistor 311 and GaN transistor 312 turn on as $V_{SUPP}$ ramps from 0V to final value.

GaN transistor 311 and GaN transistor 312 turn on as $V_G$ reaches one $V_T$ above $V_S$.

$$V_G \text{ is } V_{SUPP} - V_T - V_{301}.$$

Therefore, the low-to-high threshold (referenced to $V_{SUPP}$) voltage is:

$$V_S + V_T + V_{301} + V_{T315} \rightarrow V_S + 2V_T + V_{301}.$$

A minimum low-to-high threshold voltage is $2V_T + V_{HYS} + V_{301}$, where $V_{HYS}$ is hysteresis voltage. In the simplified circuit 300, $V_{HYS} = V_S$.

When GaN transistor 311 and GaN transistor 312 turn on, i.e., when they cross the low-to-high voltage threshold (UVLO_high_threshold), current through GaN transistor 311 is advantageously designed to be very small; thus, voltage at node $V_S$ and the UVLO signal 183 is near zero. When GaN transistor 311 and GaN transistor 312 are off, GaN transistor 313 is on. The simplified schematic 300 is designed such that current through GaN transistor 313 is high enough to generate the $V_S$ voltage which is the hysteresis voltage. Therefore, a high-to-low threshold voltage (UVLO_low_threshold) is $2V_T + V_{301}$.

The minimum UVLO threshold tracks the process because the UVLO threshold is a function of $V_T$ which changes with process.

The resistor 304 contributes to hysteresis generation for the under-voltage detector 202.

Advantageously, with the simplified schematic 300, the comparison of a reference voltage with $V_{SUPP}$ is made without requiring complicated comparators. Advantageously, because of its inverter-based comparison, the simplified schematic 300 is much faster than any known comparator-based under voltage lock-out circuits. The inverter comprises GaN resistor 303 and GaN transistor 314.

Figure 4:
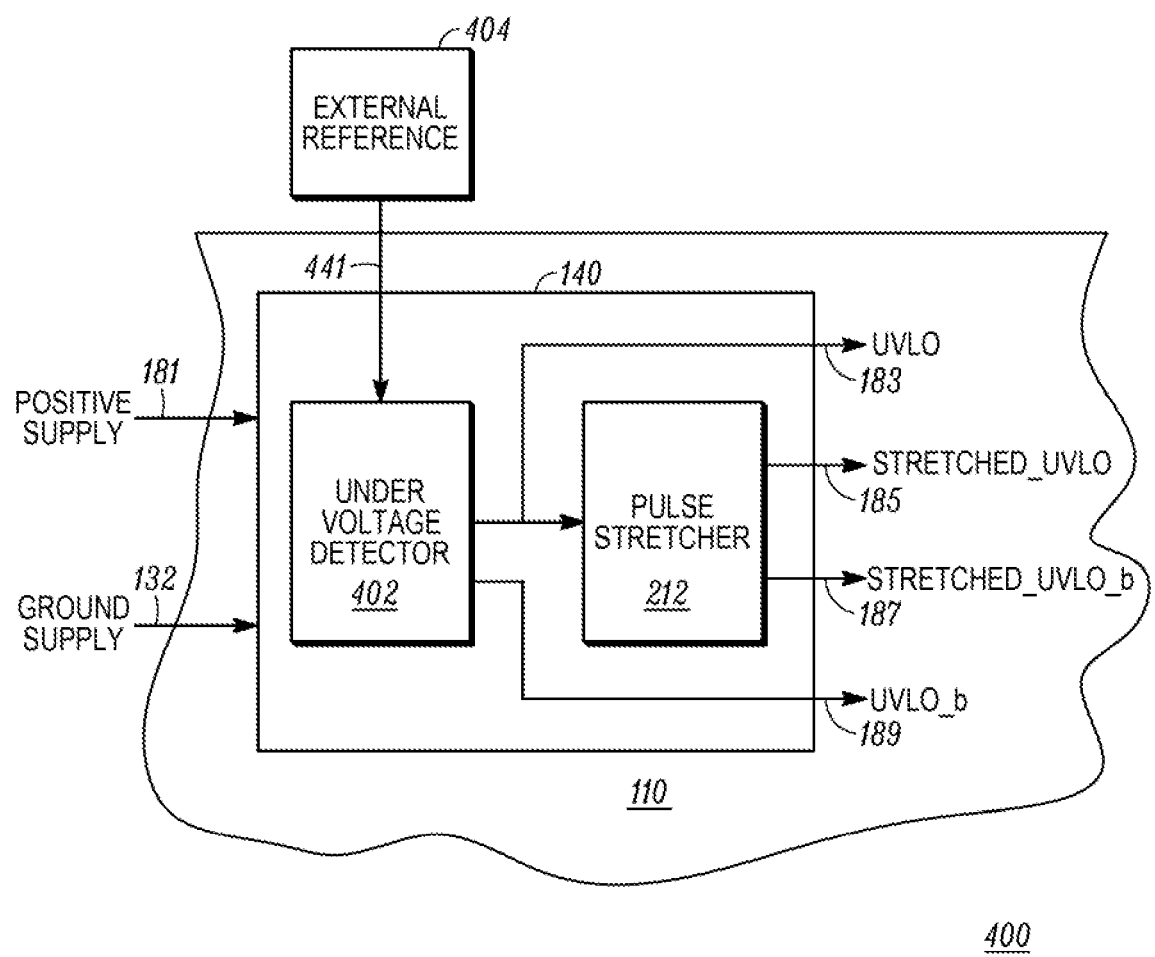
FIG. 4 is a simplified block diagram of subsystem-level architecture of a second embodiment of the under voltage lock-out circuit including an under-voltage detector in accordance with the invention, a pulse stretcher in accordance with the invention, and an external reference.

FIG. 4 is a simplified block diagram 400 of subsystem-level architecture of a second embodiment of the under voltage lock-out circuit 140 in accordance with the invention. The second embodiment of the under voltage lock-out circuit 140 comprises an under-voltage detector 402 and the pulse stretcher 212. The second embodiment of the under voltage lock-out circuit 140 is coupled to an external reference device 404.

More specifically, the external reference device 404 is located external to the die 130. In one embodiment, the external reference device 404 is located external to the microelectronic package in which the die 130 is disposed. The external reference device 404 can be any suitable device or integrated circuit used for dedicated reference generation. The external reference 404 can be a shunt regulator diode. The external reference 404 can be a low drop-out regulator. The external reference device 404 generates an external reference voltage 441.

For the detection of an under-voltage condition of the supply voltage $V_{SUPP}$ 181, the supply voltage $V_{SUPP}$ is compared against a reference voltage. In the second embodiment of the under voltage lock-out circuit 140 the external reference voltage 441 is used by the under voltage lock-out circuit to produce an internal reference voltage $V_{INT}$. For the detection of the under-voltage condition, the supply voltage $V_{SUPP}$ 181 is compared against the internal reference voltage $V_{INT}$. With the second embodiment of the under voltage lock-out circuit 140, the external reference device 404 can be referred to either a low supply (ground) or a high supply (the voltage that is being monitored). In either case of referring, the second embodiment of the under voltage lock-out circuit 140 outputs signals (UVLO 183, stretched_UVLO 185, stretched_UVLO_b 187 and UVLO_b 189) in response to the value of $V_{SUPP}$ 181.

Figure 5:
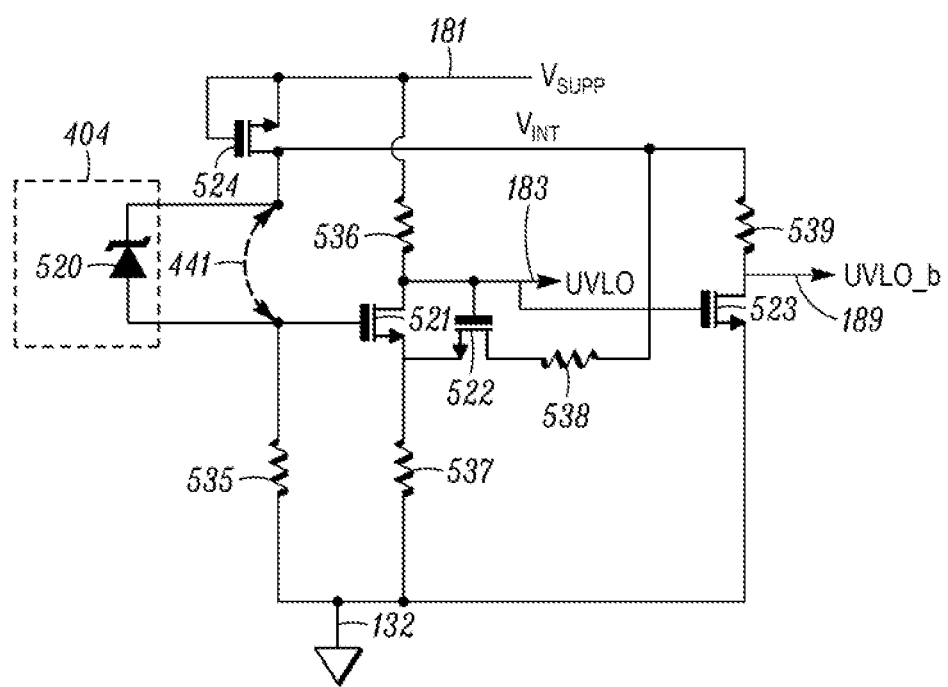
FIG. 5 is a simplified schematic of one embodiment of the under-voltage detector of FIG. 4.

FIG. 5 is a simplified schematic 500 of one embodiment of the under-voltage detector 402. In the embodiment of the under-voltage detector 402 illustrated in FIG. 5 the external reference 404 is referred to the high side supply, i.e., the positive supply. In one embodiment of the under-voltage detector 402, the external reference 404 is Zener diode 520. The Zener diode 520 provides a bandgap-based reference voltage 441 and is fabricated using silicon process. The external reference voltage 441 shown in FIG. 4 is a voltage across the Zener diode 520.

The simplified schematic 500 includes a GaN transistor 524 having a gate terminal and a source terminal coupled to the supply voltage $V_{SUPP}$ 181 and a drain terminal coupled to a cathode of the Zener diode 520. The anode of the Zener diode 520 is coupled to one end of a GaN resistor 535. The other end of GaN resistor 535 is coupled to the ground terminal 132. The supply voltage $V_{SUPP}$ 181 passes through GaN transistor 524 and generates an internal reference voltage $V_{INT}$ which goes to the Zener diode 520 biased by GaN resistor 535.

The simplified schematic 500 also includes a GaN resistor 536 having one end coupled to the positive supply terminal and the other end coupled to a drain terminal of a GaN transistor 521. A gate terminal of GaN transistor 521 is coupled to a node between Zener diode 520 and GaN resistor 535. A source terminal of GaN transistor 521 is coupled to one end of a GaN resistor 537. The other end of GaN resistor 537 is coupled to the ground terminal 132. A voltage at the drain of GaN transistor 521 produces the UVLO signal 183. As the voltage $V_{SUPP}$ rises the voltage of the UVLO signal 183 tracks the positive supply $V_{SUPP}$.

The simplified schematic 500 further includes a GaN transistor 522 having a gate terminal coupled to the drain terminal of GaN transistor 521, a source terminal coupled to the source terminal of GaN transistor 521 and a drain terminal coupled to one end of a GaN resistor 538. The other end of GaN resistor 538 is coupled to the internal reference voltage $V_{INT}$ at the drain terminal of GaN resistor 524.

The simplified schematic 500 includes a GaN transistor 523 having a gate terminal coupled to the drain terminal of GaN transistor 521, a source terminal coupled to the ground terminal 132, and a drain terminal coupled to one end of a GaN resistor 539. The other end of GaN resistor 539 is coupled to the internal reference voltage $V_{INT}$ at the drain terminal of GaN transistor 524. A voltage at the drain of GaN transistor 523 produces the UVLO_b signal 189.

The internal voltage $V_{INT}$ is a diode drop lower than the supply voltage $V_{SUPP}$ 181. Once $V_{INT}$ reaches a voltage greater than the breakdown voltage $V_Z$ of the Zener diode, the threshold voltage of GaN transistor 521 and the voltage drop across resistor 537, GaN transistor 521 turns on, the output voltage UVLO falls to zero and the other output voltage UVLO_b goes to $V_{INT}$. Likewise, as $V_{SUPP}$ starts to fall and crosses the threshold voltage of GaN transistor 521 it turns off, and the output voltage UVLO starts to track $V_{SUPP}$.

The resistor 537 contributes to the hysteresis generation for the output voltage UVLO, as follows. A voltage drop across resistor 537 is equal to the current flowing through resistor 538 and GaN transistor 522 times the value of resistor 537. Likewise, the voltage drops across 537 is equal to the current flowing through GaN resistor 536 and GaN transistor 521 times the value of resistor 537. By design, GaN resistor 536 is larger than GaN resistor 538, so in two voltage conditions it gives two different voltages across the resistor 537 which in turn generates the hysteresis voltage.

Advantageously, the simplified schematic 500 generates the UVLO signal 183 largely independent of process variation and largely independent of $V_T$.

The simplified schematic 500 is a complete GaN-based monolithically integrated under voltage lock-out circuit that can use any reference device. Because the simplified schematic 500 is an inverter-based design, it has an ultra-fast response time in the order of 50 ns at the expense of a few microamperes of current. The inverter comprises GaN resistor 539 and GaN transistor 523.

Figure 6:
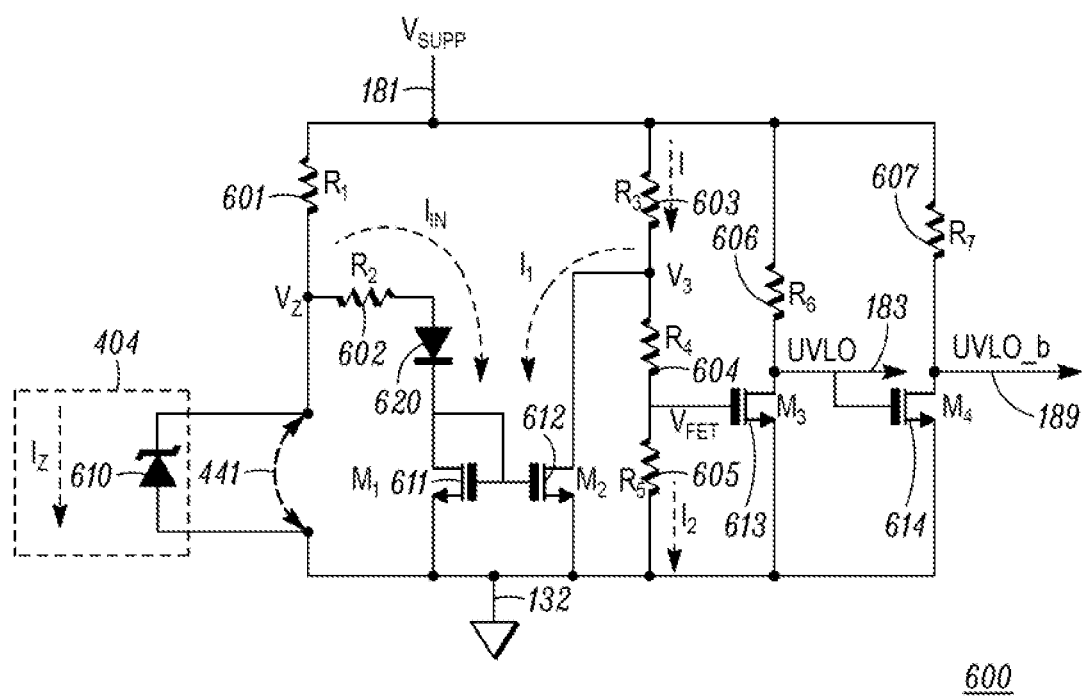
FIG. 6 is a simplified schematic of another embodiment of the under-voltage detector of FIG. 4.

FIG. 6 is a simplified schematic 600 of another embodiment of the under-voltage detector 402. In the embodiment of the under-voltage detector 402 shown in FIG. 6, the external reference 404 is referred the low side supply, i.e., the ground terminal 132. In this embodiment of the under-voltage detector 402, the external reference 404 is a Zener diode 610. The Zener diode $D_Z$ 610 provides a bandgap-based reference voltage 441 and is fabricated using silicon process.

The simplified schematic 600 of the under-voltage detector 402 includes a GaN resistor $R_1$ 601 coupled between a positive supply terminal $V_{SUPP}$ and a cathode of Zener diode 610. An anode of Zener diode 610 is coupled to the ground terminal 132. A current through Zener diode 610 is $I_Z$. The external reference voltage 441 shown in FIG. 4 is a voltage across Zener diode 610. A GaN resistor $R_2$ 602 is coupled between the cathode of Zener diode 610 and an anode of GaN diode 620. A cathode of GaN diode 620 is coupled to a drain terminal of GaN transistor $M_1$ 611.

The simplified schematic 600 of the under-voltage detector 402 further comprises a GaN resistor $R_3$ 603 with one end coupled to the positive supply terminal $V_{SUPP}$ and another end coupled to one end of a GaN resistor $R_4$ 604. The other end of GaN resistor $R_4$ 604 coupled to one end of GaN resistor $R_5$ 605. The other end of GaN resistor $R_5$ 605 is coupled to the ground terminal 132.

The simplified schematic 600 of the under-voltage detector 402 comprises a resistor $R_6$ 606 having one end coupled to the positive supply terminal $V_{SUPP}$ and another end coupled to a drain terminal of GaN transistor $M_3$ 613. A gate terminal of GaN transistor $M_3$ 613 is coupled to a node between GaN resistor $R_4$ 604 and GaN resistor $R_5$ 605. A source terminal of GaN transistor $M_3$ 613 is coupled to the ground terminal 132.

The simplified schematic 600 of the under-voltage detector 402 compares a reference voltage with the positive supply $V_{SUPP}$. The simplified schematic 600 minimizes the effects of process variations on the threshold voltage $V_T$ of GaN transistor $M_3$ 613. In doing so, a current proportional to $V_T$ of GaN transistor 613 is subtracted, using a current mirror, from a resistance network comprising GaN resistor 603, GaN resistor 604 and GaN resistor 605. As the $V_{SUPP}$ builds up, the voltage $V_{FET}$ at the gate of the GaN transistor 613 reaches $V_T$ and it turns on. A voltage at a drain of GaN transistor 613 produces the output signal UVLO 183.

The simplified schematic 600 also includes a GaN resistor $R_7$ 607 having one end coupled to the positive supply terminal $V_{SUPP}$ and another end coupled to a drain terminal of GaN transistor $M_4$ 614. A gate terminal of GaN transistor $M_4$ 614 is coupled to the drain terminal of GaN transistor $M_3$ 613. A source terminal of GaN transistor $M_4$ 614 is coupled to the ground terminal. A voltage at a drain of GaN transistor $M_4$ 614 produces the output signal UVLO_b 189.

The Zener diode $D_Z$ 610 generates a voltage $V_Z$. The Zener diode $D_Z$ 610 is biased by resistor $R_1$ 601.

The current $I_{IN}$ through GaN transistor $M_1$ 611 is equal to $(V_Z-2V_T)/R_1$.

A current mirror comprising GaN transistor $M_1$ 611 and GaN transistor $M_2$ 612 copies the current $I_{IN}$ through GaN transistor $M_2$ 612. The current through GaN transistor $M_2$ 612 is equal to $I_1=I_{IN}$.

A current through GaN resistor $R_3$ 603 is equal to $I_1+I_2$. $I_2$ is equal to the voltage drop $V_{FET}/R_5$. The voltage $V_3$ is the sum of the voltage drop across resistors $R_4$ and $R_5$, which is equal to $V_{FET}+V_{FET}(R_4/R_5)$.

Therefore, the voltage being monitored, $V_{SUPP}$, which appears across the resistor divider consisting of $R_3$, $R_4$ and $R_5$, is $V_{FET}(1+R_4/R_5)+IR_3$ which is equivalent to $V_{FET}(1+R_4/R_5)+\{(V_Z-2V_T)/R_1+V_{FET}/R_5\}R_3$. The voltage $V_{FET}$, which turns on GaN transistor $M_3$ 613 and decides the threshold of the UVLO, is $$V_{FET}=kV_{SUPP}+(2R_3R_5)/R_2(R_3+R_4+R_5)*V_T-(R_3R_5)/R_2(R_3+R_4+R_5)*V_Z.$$

The value of $k=R_5/(R_3+R_4+R_5)$ can be chosen as a design parameter to make the quotient of the second term equal to one. The quotient of the third term can be chosen by considering $V_{FET}$ (which is the turn-on voltage) equal to the threshold voltage. As a result, a UVLO threshold that does not have any $V_T$-dependent parameter is obtained. Consequently, the embodiment of the under-voltage detector 402 illustrated in FIG. 6 has process compensation.

A quantitative analysis of the circuit shown in FIG. 6 is given below.

The current flowing through $M_1$ is $I_{IN}=(V_Z-2V_T)/R_2$.

Similarly, current I through $R_3$ is $I_1+I_2$, where $I_2=V_{FET}/R_5$.

$$V_3=V_{FET}+V_{FET}(R_4/R_5)$$

$$V_3=V_{FET}(1+R_4/R_5)$$

$$V_{SUPP}=V_{FET}(1+R_4/R_5)+(I_1+I_2)R_3$$

$$V_{SUPP}=V_{FET}(1+R_4/R_5)+\{(V_Z-2V_T)/R_2\}R_3+(V_{FET}/R_5)R_3$$

Current $I_1$ and $I_{IN}$ are same because of current mirroring.

$$V_{FET}=\{R_5/(R_3+R_4+R_5)\}V_{SUPP}+(2V_T-V_Z)(R_3/R_2)\{R_5/(R_3+R_4+R_5)\}$$

$$V_{FET}=kV_{SUPP}+(2R_3R_5)/R_2(R_3+R_4+R_5)*V_T-(R_3R_5)/R_2(R_3+R_4+R_5)*V_Z$$

The value of k is chosen as per design, and the choice of the value of k makes the quotient of the second term equal to one. The quotient of the third term is chosen by considering the $V_{FET}$ voltage equal to the threshold voltage. In this way, the resistance values are chosen.

All known Zener-based under voltage lock-out circuits use a Zener diode in the high side. Advantageously, the simplified schematic 600 uses a reference voltage in the low side; consequently, it is easier to integrate the simplified schematic 600 with a Zener-based linear regulator because all known Zener-based linear regulators use a reference voltage with respect to the low side. Advantageously, with an appropriate choice of the design parameter, the simplified schematic 600 has an UVLO threshold that does not depend on the $V_T$ of GaN devices.

Figure 7:
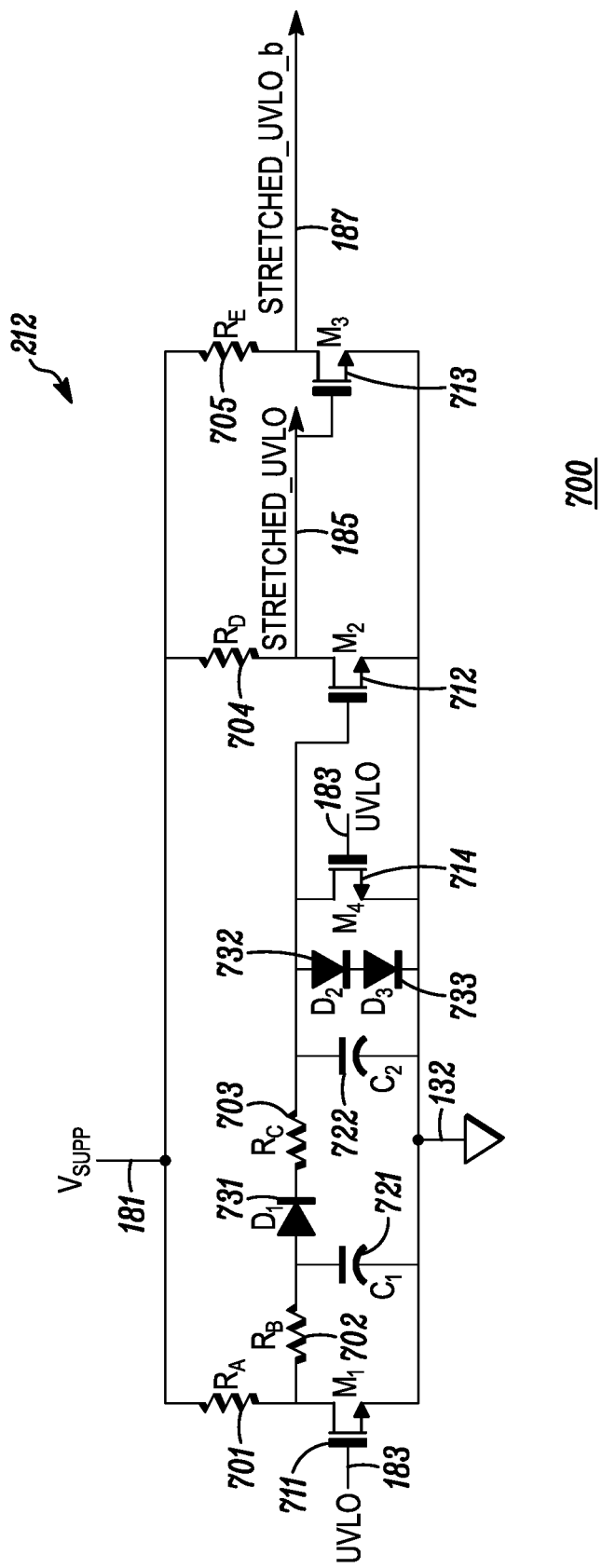
FIG. 7 is a simplified schematic of an embodiment of the pulse stretcher.

FIG. 7 is a simplified schematic 700 of an embodiment of the pulse stretcher 212. Because of an absence of a bandgap voltage in the under-voltage detectors shown in FIGS. 3, 5 and 6, the under-voltage detectors in accordance with the invention cannot accurately measure the supply voltage $V_{SUPP}$ 181; therefore, the pulse stretcher 212 is useful. The under-voltage lock-out circuit 140 continually generates the UVLO signal 183 but only as long as a low-voltage condition exists with respect to $V_{SUPP}$. The pulse stretcher 212 is synchronous to the under-voltage detector 202 and 402. A width of the stretched_UVLO 185 depends on how soon the UVLO signal 183 goes low. Therefore, the UVLO signal 183 coordinates the pulse stretcher 212. The pulse stretcher 212 increases a duration, i.e., width, of the UVLO signal 183 by a fixed amount. In one embodiment of the pulse stretcher 212, when the supply voltage $V_{SUPP}$ 181 has a ramp rate of 50 ns, the width of the stretched_UVLO 185 ramp is 60 ns. As the ramp rate of the supply voltage $V_{SUPP}$ 181 changes, so does the width of the stretched_UVLO 185.

The pulse stretcher 212 includes a GaN resistor $R_A$ 701 coupled between a positive supply terminal $V_{SUPP}$ and a drain terminal of a GaN transistor $M_1$ 711. A source terminal of GaN transistor $M_1$ 711 is coupled to the ground terminal 132. A gate terminal of GaN transistor $M_1$ 711 is coupled to the UVLO signal 183 outputted by the under-voltage detector 140. One end of a GaN resistor $R_B$ 702 is coupled to the drain terminal of GaN transistor 711 and another end of the GaN resistor $R_B$ is coupled to a GaN capacitor $C_1$ 721 and to an anode of a GaN diode $D_1$ 731. Another end of GaN capacitor $C_1$ 721 is coupled to the ground terminal 132.

A cathode of GaN diode $D_1$ 731 is coupled to one end of GaN resistor $R_C$ 703. Another end of GaN resistor $R_C$ 703 is coupled to one end of GaN capacitor $C_2$ 722, to an anode of GaN diode $D_2$ 732, to a drain terminal of GaN transistor $M_4$ 714 and to a gate terminal of GaN transistor $M_2$ 712. A cathode of GaN diode $D_2$ 732 is coupled to an anode of GaN diode $D_3$ 733. A cathode of GaN diode $D_3$ 733 is coupled to the ground terminal 132. A source terminal of GaN transistor $M_4$ 714 is coupled to the ground terminal 132. A gate terminal of GaN transistor $M_4$ 714 is coupled to the UVLO output signal 183 outputted by the under-voltage detector 140.

A GaN resistor $R_D$ 704 is coupled between the positive supply terminal and a drain terminal of GaN transistor $M_2$ 712. The pulse stretcher 212 produces the stretched_UVLO signal 185 at the drain terminal of GaN transistor $M_2$ 712. A source terminal of GaN transistor $M_2$ 712 is coupled to the ground terminal 132.

A GaN resistor RE 705 is coupled between the positive supply terminal and a drain terminal of GaN transistor $M_3$ 713. A gate terminal of GaN transistor $M_3$ 713 is coupled to the drain terminal of GaN transistor $M_2$ 702. A source terminal of GaN transistor $M_3$ 713 is coupled to the ground terminal 132. The pulse stretcher 212 produces the stretched_UVLO_b signal 187 at the drain of drain terminal of GaN transistor $M_3$ 713.

As the supply voltage $V_{SUPP}$ 181 rises from zero, the input signal (UVLO 183) to the pulse stretcher 212 is also rising from zero. If UVLO 183 is below the threshold voltage, GaN transistors $M_1$ 711 and $M_2$ 712 remain in cutoff and the output signal (stretched_UVLO 185) from the pulse stretcher 212 follows the supply voltage $V_{SUPP}$ 181 with a delay given by Equation (1) below. During this interval, GaN capacitor $C_1$ 721 is charged to a certain voltage.

With a slower ramp rate of the supply voltage $V_{SUPP}$ 181, it takes more time for $V_{SUPP}$ to reach a final steady state value. With a faster ramp rate of the supply voltage $V_{SUPP}$ 181, it takes less time for $V_{SUPP}$ to reach a final steady state value. Therefore, the pulse stretcher 212 advantageously extends the UVLO signal 183 by a predetermined amount of time depending on a ramp rate of $V_{SUPP}$ and an amplitude of $V_{SUPP}$. The predetermined amount of time is a function of ramp rate of the supply voltage. The predetermined amount of time increases as the ramp rate of the supply voltage decreases.

When UVLO 183 crosses the threshold voltage, GaN transistor $M_1$ 711 turns on, GaN capacitor $C_1$ 721 discharges through $R_B$ 702 and stretched_UVLO 185 starts to rise and follows V SUPP with a RC delay given by Equation (1).

$$\tau_{output}=R_D(C_{DS2}+C_{DB2}+C_{GS3}) \qquad (1)$$

where $C_{DS2}$ is capacitance between the drain and the source of GaN transistor $M_2$ 712, where $C_{DB2}$ is capacitance between the drain and the base of GaN transistor $M_2$ 712, and where $C_{GS3}$ is capacitance between the gate and the source of GaN transistor $M_3$ 713.

A delay between the UVLO 183 and stretched_UVLO 185 occurs due to a delay within pulse stretcher 212.

Once a rising supply voltage $V_{SUPP}$ 181 has crossed the UVLO high threshold (see FIG. 8), the input signal (UVLO 183) to the pulse stretcher 212 drops to zero; therefore, the transistor $M_1$ turns off and GaN capacitor $C_1$ 721 starts to charge through GaN resistor $R_A$ 701 and GaN resistor $R_B$ 702 with a time constant given by Equation (2). As the supply voltage $V_{SUPP}$ 181 grows across GaN capacitor $C_1$ and crosses the threshold voltage of diode $D_1$ 731, diode $D_1$ starts to conduct and the GaN capacitor $C_2$ 722 starts to charge with a RC delay given by Equation (3).

$$\tau_1=(R_a+R_b)C_1 \qquad (2)$$

$$\tau_2=R_c(C_2+C_{GS3}) \qquad (3)$$

where $C_{GS3}$ is a gate-to-source capacitance of GaN transistor $M_3$ 713.

Slowly, the voltage at a gate of GaN transistor $M_2$ 712 crosses its threshold voltage and it turns on while pulling down stretched_UVLO 185 to zero. Then, stretched_UVLO_b 187 goes high. Therefore, as $V_{SUPP}$ starts to rise, a signal at the output of the pulse stretcher is delayed from the input signal by $\tau_1+\tau_2$. Similarly, as $V_{SUPP}$ starts to fall, a signal at the output of the pulse stretcher 212 is delayed from the signal at the input of the pulse stretcher by $\tau_1+\tau_2$.

Advantageously, the under-voltage lockout circuit 140 is capable of working with an ultra-fast ramp rate of $V_{SUPP}$. Laboratory results have shown that the under-voltage lockout circuit 140 is responsive for a ramp rate of the voltage supply in the order of 40-50 ns.

The pulse stretcher 212 can be added to any of the illustrated embodiments (simplified schematic 300, 500 and 600) of the under-voltage detector 140.

Advantageously, the pulse stretcher 212 is an all-GaN-based approach that enhances a fault signal, i.e., UVLO signal 183 by a definite length of time.

Figure 8:
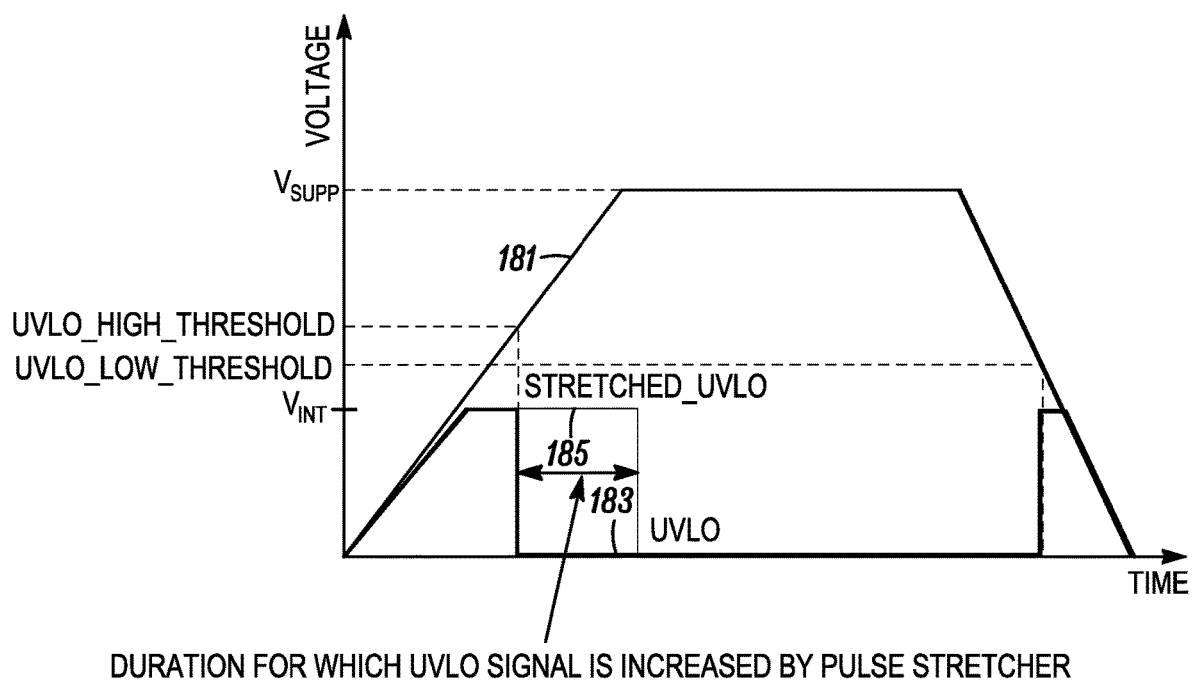
FIG. 8 is a graph of voltage versus time and shows a duration for which a UVLO signal is increased by the pulse stretcher.

FIG. 8 shows that the UVLO signal 183 goes from high to low once the voltage being monitored, $V_{SUPP}$, crosses a UVLO_high_threshold voltage. However, FIG. 8 shows that $V_{SUPP}$ is still ramping up beyond the UVLO_high_threshold voltage. For a high ramp rate of $V_{SUPP}$, internal circuitry of the driver 110 may not have settled to a steady state and the driver could unintentionally turn on the GaN power switch 120. A function of the pulse stretcher 212 is to keep a gate of the GaN power switch 120 low until $V_{SUPP}$ is settled to a final value. This is done by generating stretched_UVLO 185 which is triggered for a predetermined duration after the UVLO signal 183 has triggered. The predetermined duration typically occurs continues until after $V_{SUPP}$ is settled. The stretched_UVLO signal 185 is basically a delayed version of the UVLO signal 183.

The pulse stretcher 212 minimizes an effect of process-related threshold variation of the under-voltage lock-out circuit 140 without using any complicated GaN-based comparator architecture.

Other embodiments (not shown) of the pulse stretcher 212 can comprise a monostable multi-shot generator or a one-shot generator.

The output signals of the under-voltage lock-out circuit 140 go to various other circuits and devices, wherein the final output signals turn on/off the other circuits and devices, and/or enable/disable the other circuits and devices. Appropriate level shifts or other signal conditioning may be added to make the output signals of the under-voltage lock-out circuit 140 more useful.

In each embodiment under voltage lock-out circuit in accordance with the invention, the comparison of the reference voltage with the supply voltage $V_{SUPP}$ 181 is made without requiring complicated comparators.

All known under voltage lock-out circuits use an external voltage reference that can only be referred to a ground terminal or to a low-side-supply rail. Advantageously, with the under-voltage lock-out circuit 140 in accordance with the invention, the Zener diode 520 and 610 or any other external reference voltage can be, and is, referred to the positive supply voltage or high-side-supply rail.

Except for the external reference 404, all the devices of the circuits in accordance with the invention are realized through only N-channel enhancement-mode GaN HEMTs and by diodes and resistors and capacitors that are fabricated in GaN processes. No P-type metal oxide semiconductor device is used in the circuits in accordance with the invention, except that the external reference 404 may comprise one or more P-type metal oxide semiconductor devices.

The circuits in accordance with the invention, except for the external reference 404, are capable of being on a same GaN die 104. The GaN driver 110 and the GaN power switch 120 being on one GaN die 104 provides excellent response compared to being on more than one GaN die. A single die also provides reduction of cost and complexity compared to more than one die.

In another embodiment (not shown), the GaN driver 110 and the GaN power switch 120 are on separate dies, but the separate dies are in a same microelectronic package. In yet another embodiment (not shown), the GaN driver 110 and the GaN power switch 120 are in separate microelectronic packages.

Although most of the description herein focuses on GaN HEMT based technology, the topology of the disclosed circuits and their application are independent of the device technology platform, and can be easily extended to silicon or other present or future semiconductor platforms.

Some features of the present invention may be used in an embodiment thereof without use of other features of the present invention. As such, the foregoing description should be considered as merely illustrative of the principles, teachings, examples, and exemplary embodiments of the present invention, and not a limitation thereof.

These embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. A design of the chip is created in a graphical computer programming language, and stored in a computer storage medium (such as a disk, tape, physical hard drive, or virtual hard drive such as in a storage access network). If a designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into an appropriate format (e.g., GDSII) for fabrication of photolithographic masks, which typically include multiple copies of the chip design that are to be formed on a wafer. The photolithographic masks are utilized to define areas of the wafer (and/or the layers thereon) to be etched or otherwise processed.

The methods as discussed above are used in fabrication of integrated circuit chips. The resulting integrated circuit chips can be distributed by a fabricator in raw wafer form (that is, as a single wafer that has multiple unpackaged chips), as a bare chip, or in a packaged form. In the latter case, the chip is mounted in a single chip package or in a multichip package. In any case, the chip is then integrated with other chips, discrete circuit elements, and/or other signal processing devices as part of either (a) an intermediate product, such as a motherboard, or (b) an end product. An end product can be any product that includes integrated circuit chips, ranging from toys and other low-end applications to advanced computer products (such as, but not limited to, an information processing system) having a display, a keyboard, or other input device, and a central processor.

Unless stated otherwise, terms such as "first" and "second" are used to arbitrarily distinguish between the elements that such terms describe. Thus, these terms are not necessarily intended to indicate temporal or other prioritization of such elements.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. An electronic circuit comprising:
  a GaN FET power switch; and
  a driver for the GaN FET power switch, the driver including:
  a reference device for generating a reference voltage,
  a GaN-based under-voltage detector having a first input terminal receiving a supply voltage, a second input terminal for receiving a voltage at ground potential, a third input terminal receiving the reference voltage, and an output terminal, wherein the reference voltage is referred to the supply voltage, and wherein the GaN-based under-voltage detector outputs an under voltage lock-out signal when the supply voltage is below a low-to-high threshold value, and does not output the under voltage lock-out signal when the supply voltage is above the low-to-high threshold value, and
  a pulse stretcher having an input terminal coupled to the output terminal of the GaN-based under-voltage detector, and an output terminal for outputting a stretched under voltage lock-out signal for a predetermined amount of time after the supply voltage first rises above the low-to-high threshold value, the pulse stretcher comprising:
    a first transistor having a drain, a source coupled to ground potential, and a gate coupled to the input terminal of the pulse stretcher,
    a first resistor coupled between the supply voltage and the drain of the first transistor,
    a second resistor having one end coupled to the drain of the first transistor,
    a first capacitor coupled between another end of the second resistor and ground potential,
    a first diode having an anode coupled to the other end of the second resistor, a third resistor having one end coupled to a cathode of the first diode,
    a second capacitor coupled between another end of the third resistor and ground potential,
    a second diode having an anode coupled to another end of the third resistor,
    a third diode having an anode coupled to a cathode of the second diode and a cathode coupled to ground potential,
    a second transistor having a drain coupled to the other end of the third resistor, a source coupled to ground potential, and a gate coupled to the input terminal of the pulse stretcher,
    a third transistor having a drain, a gate coupled to the other end of the third resistor, and a source coupled to ground potential, and
    a fourth resistor coupled between the supply voltage and the drain of the third transistor,
  wherein the stretched under voltage lock-out signal is produced at the drain of the third transistor.

2. The electronic circuit of claim 1, wherein the reference device is fabricated using a silicon process.

3. The electronic circuit of claim 2, wherein the reference device is a Zener diode.

4. The electronic circuit of claim 1, wherein the predetermined amount of time is a function of ramp rate of the supply voltage.

5. The electronic circuit of claim 4, wherein the predetermined amount of time increases as the ramp rate of the supply voltage decreases.

6. The electronic circuit of claim 1, wherein the low-to-high threshold value is independent of threshold voltage of GaN devices of the GaN-based under-voltage detector.

7. An integrated circuit, comprising:
  a substrate;
  a GaN FET power switch disposed on the substrate; and
  a GaN-based driver disposed on the substrate and coupled to the GaN FET power switch, the GaN-based driver having an input terminal for receiving a supply voltage, the GaN-based driver including:
  an under-voltage detector comprising:
    a first GaN transistor having source and gate coupled to the input terminal and a drain coupled to ground through first and second resistors connected in series and having a node therebetween,
    a second GaN transistor having a gate coupled to the node,
    a third resistor having one end coupled to the input terminal and another end coupled to a drain of the second GaN transistor,
    a third GaN transistor having a gate coupled to the node and a source coupled to ground,
    a fourth resistor coupled between a source of the second GaN transistor and a drain of the third GaN transistor,
    a fourth GaN transistor having a gate coupled to the other end of the third resistor, a source coupled to the source of the second GaN transistor, and a drain coupled to the drain of the first GaN transistor through a fifth resistor, and
    an output terminal at the drain of the second transistor for generating an under voltage lock-out signal,
  wherein the under-voltage detector outputs the under voltage lock-out signal when the supply voltage is below a low-to-high threshold value, and does not output the under voltage lock-out signal when the supply voltage is above the low-to-high threshold value, and
  a pulse stretcher having an input terminal coupled to the output terminal of the under-voltage detector and an output terminal for outputting a stretched under voltage lock-out signal for a predetermined amount of time after the supply voltage rises above the low-to-high threshold value.

8. The integrated circuit of claim 7, wherein a minimum low-to-high threshold value is greater than 2 times threshold voltage of fabrication process of the GaN-based driver.

9. The integrated circuit of claim 8, wherein the minimum low-to-high threshold value tracks the threshold voltage of the fabrication process of the GaN-based driver.

10. The integrated circuit of claim 7, wherein the predetermined amount of time is a function of ramp rate of the supply voltage.

11. The integrated circuit of claim 10, wherein the predetermined amount of time increases as the ramp rate of the supply voltage decreases.

12. The electronic circuit of claim 1, wherein the pulse stretcher is totally GaN-based.

13. The electronic circuit of claim 12, wherein each transistor is a N-channel enhancement-mode GaN high-electron-mobility transistor.

14. The integrated circuit of claim 7, wherein all the resistors are GaN-based.

* * * * *